(12) United States Patent
Kuge et al.

(10) Patent No.: US 10,026,743 B2
(45) Date of Patent: Jul. 17, 2018

(54) SEMICONDUCTOR MEMORY DEVICE AND METHOD FOR MANUFACTURING SAME

(71) Applicant: TOSHIBA MEMORY CORPORATION, Minato-ku (JP)

(72) Inventors: Nobuhito Kuge, Yokkaichi (JP); Tatsuya Fujishima, Yokkaichi (JP); Masayuki Shishido, Yokkaichi (JP); Akira Kuramoto, Kuwana (JP); Hideto Onuma, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/353,112

(22) Filed: Nov. 16, 2016

(65) Prior Publication Data

US 2018/0047741 A1 Feb. 15, 2018

Related U.S. Application Data

(60) Provisional application No. 62/375,001, filed on Aug. 15, 2016.

(51) Int. Cl.
*H01L 27/11* (2006.01)
*H01L 27/11556* (2017.01)
*H01L 27/11521* (2017.01)

(52) U.S. Cl.
CPC .. *H01L 27/11556* (2013.01); *H01L 27/11521* (2013.01)

(58) Field of Classification Search
CPC .... H01L 27/11; H01L 27/115; H01L 27/1152; H01L 27/1156; H01L 27/11521; H01L 27/11556

USPC ......................................................... 257/315
See application file for complete search history.

(56) References Cited

U.S. PATENT DOCUMENTS

| | | | |
|---|---|---|---|
| 7,395,518 B2 | 7/2008 | Ciplickas et al. | |
| 7,638,263 B2 | 12/2009 | Sim | |
| 7,768,004 B2 | 8/2010 | Shintaku | |
| 7,977,733 B2 | 7/2011 | Shiino et al. | |

(Continued)

FOREIGN PATENT DOCUMENTS

| | | |
|---|---|---|
| JP | 2006-120962 | 5/2006 |
| JP | 2007-243134 | 9/2007 |

(Continued)

*Primary Examiner* — Monica D Harrison
(74) *Attorney, Agent, or Firm* — Oblon, McClelland, Maier & Neustadt, L.L.P.

(57) ABSTRACT

A semiconductor memory device includes a stacked body including a plurality of word lines; a semiconductor layer extending through the word lines; a memory cell provided at a part where the semiconductor layer crosses one of the word lines, the memory cell including a plurality of cell layers, the cell layers including a first insulating layer; and at least one of a first structural body and a second structural body provided around the stacked body. The first structural body includes a plurality of monitor layers including same materials respectively as materials of the cell layers. The second structural body includes a first electrode, a second electrode and an insulating body positioned between the first electrode and the second electrode. The insulating body includes same material as a material of the first insulating layer, and has almost the same thickness as a thickness of the first insulating layer.

17 Claims, 16 Drawing Sheets

(56) References Cited

U.S. PATENT DOCUMENTS 8,314,455 B2 11/2012 Shiino et al.
8,766,349 B2 * 7/2014 Park ..................... H01L 27/115
　　　　　　　　　　　　　　　　　　257/314

FOREIGN PATENT DOCUMENTS

| JP | 4064925 | 3/2008 |
| JP | 4649487 | 3/2011 |
| JP | 5544183 | 7/2014 |

* cited by examiner

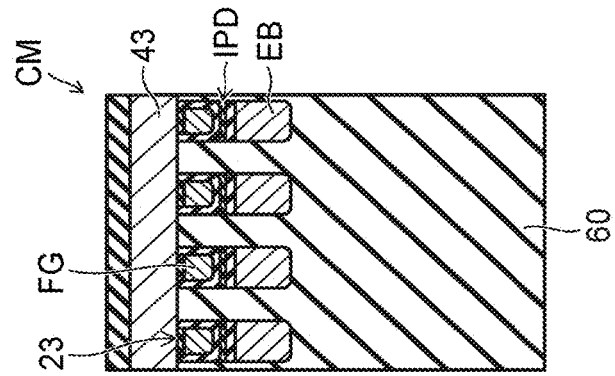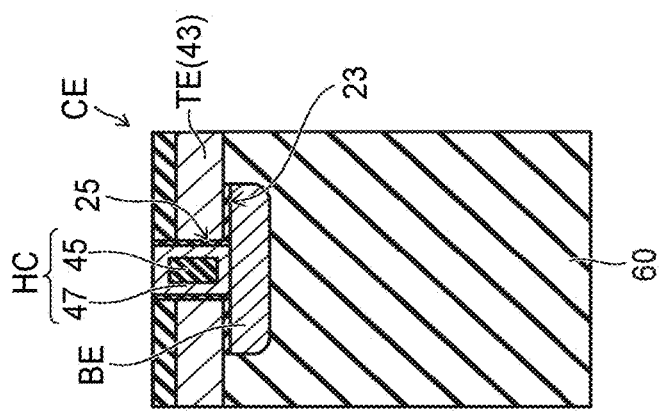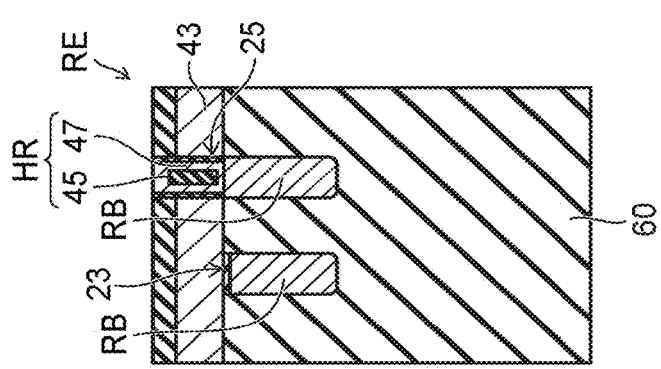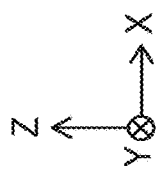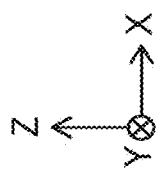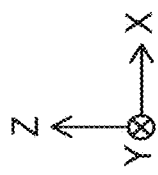

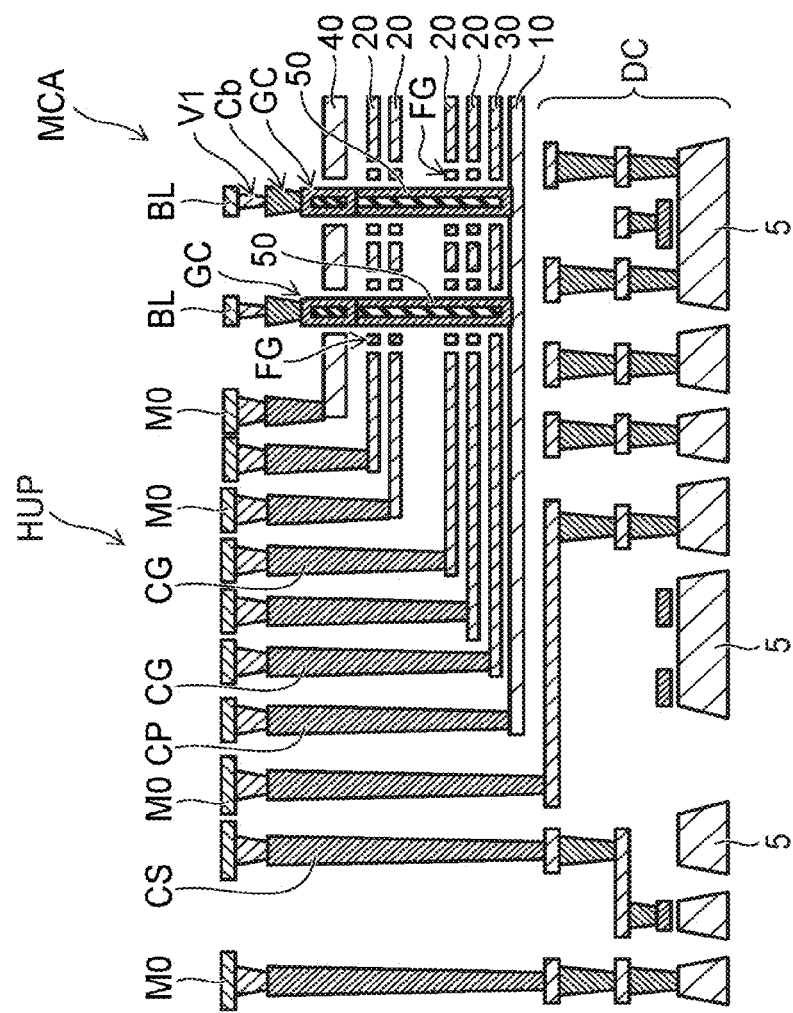
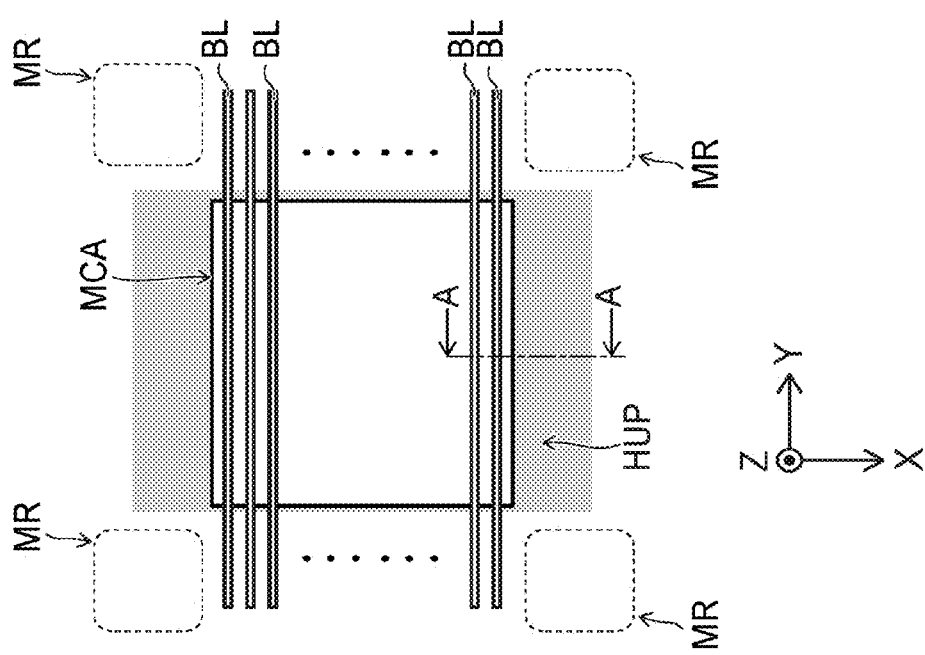
FIG. 4A
FIG. 4B

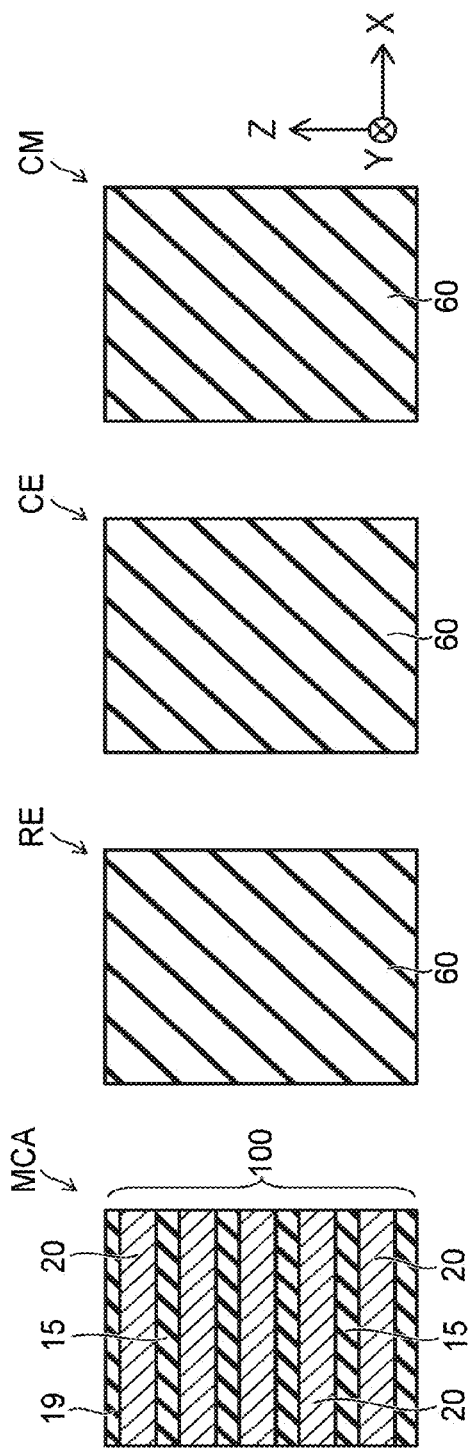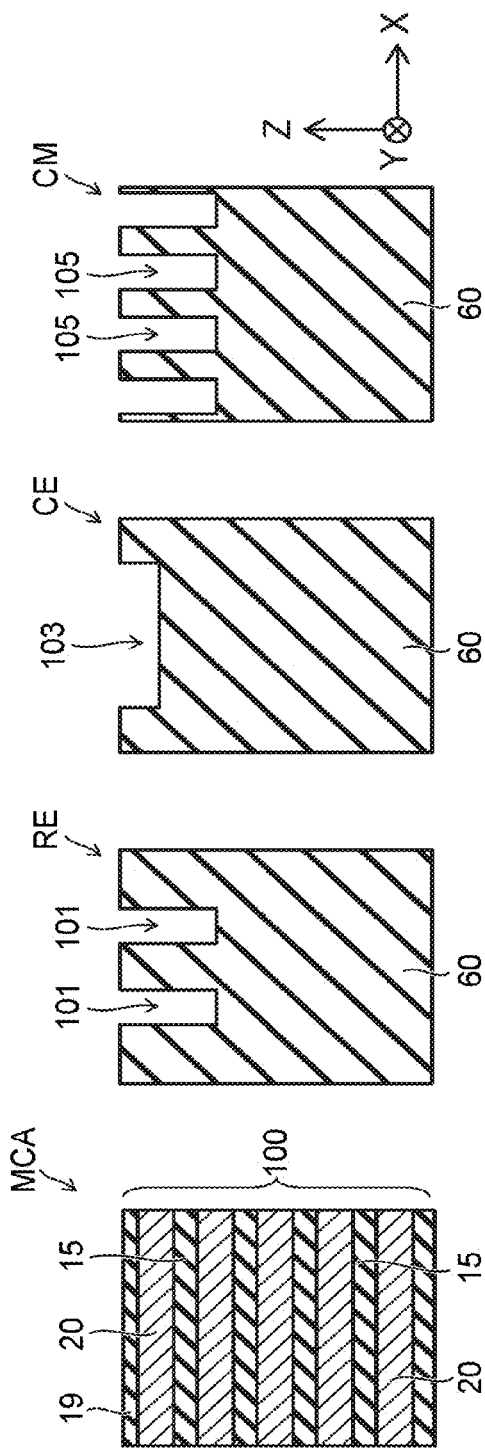
FIG. 5A
FIG. 5B

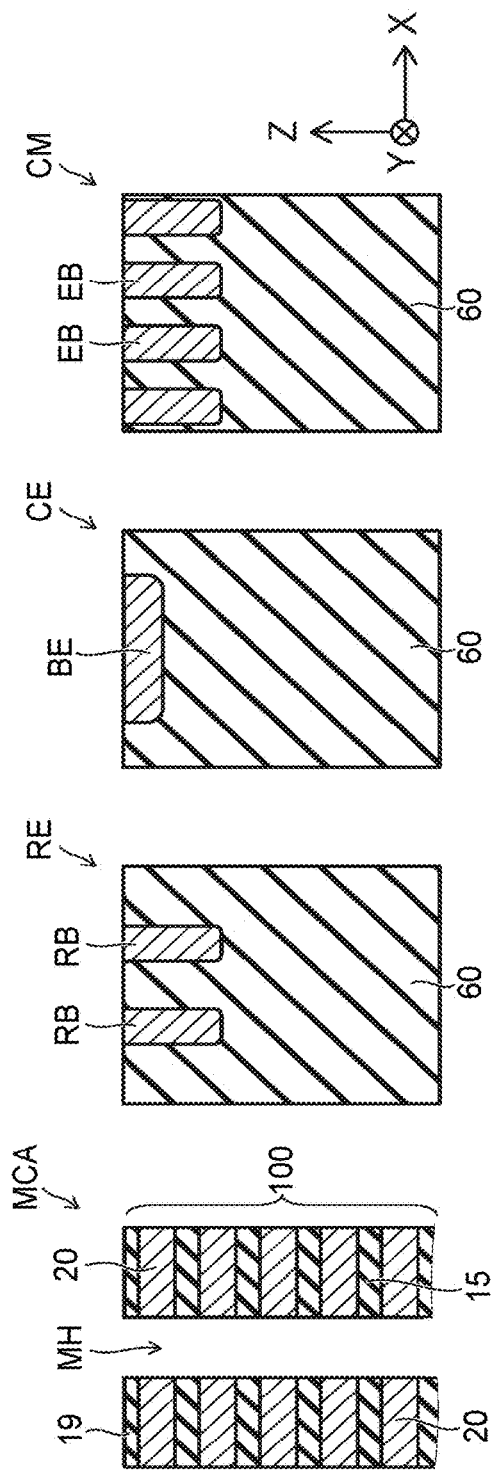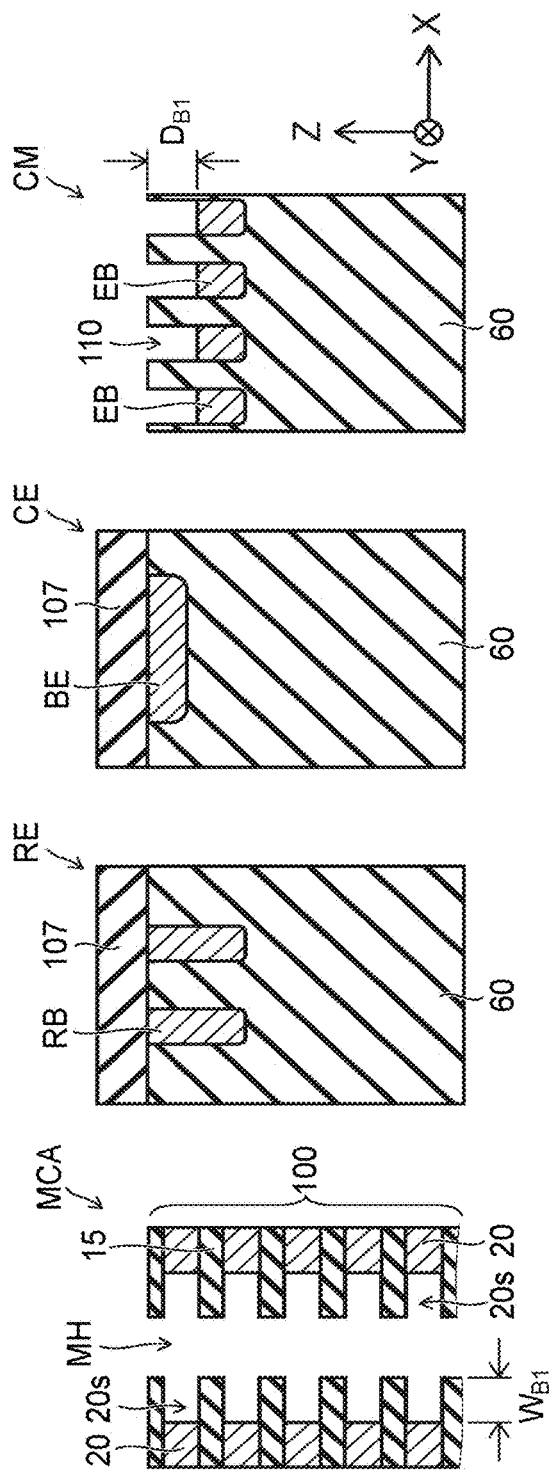
FIG. 5E
FIG. 5F

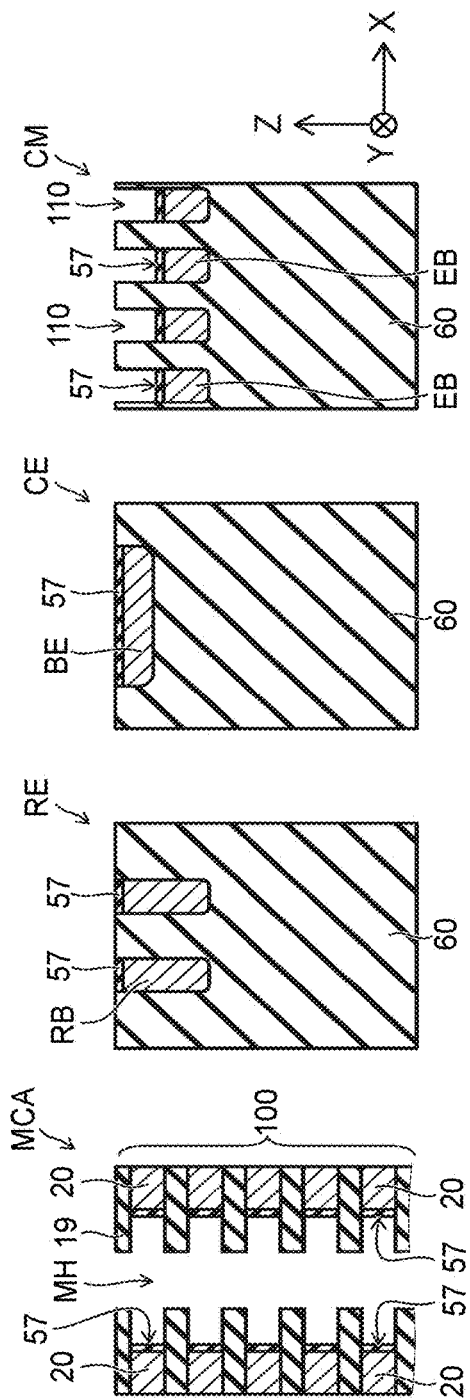
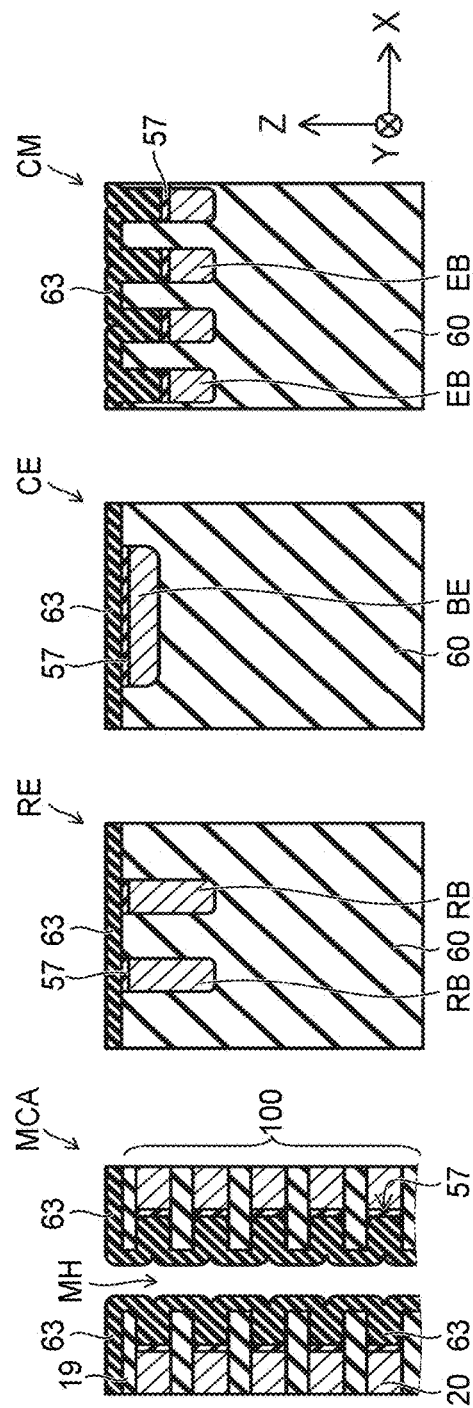
FIG. 5G
FIG. 5H

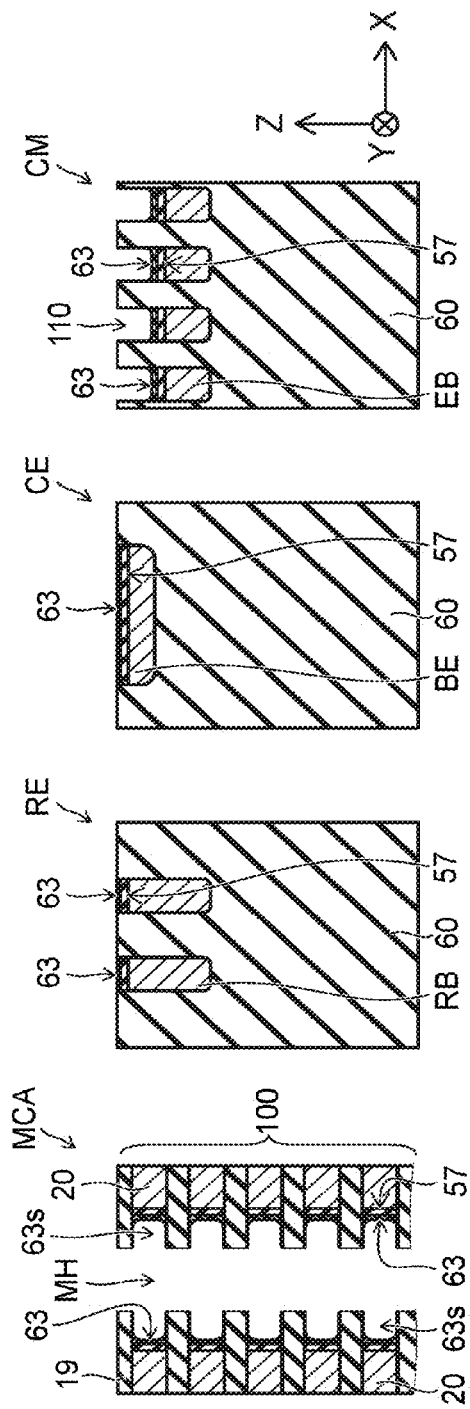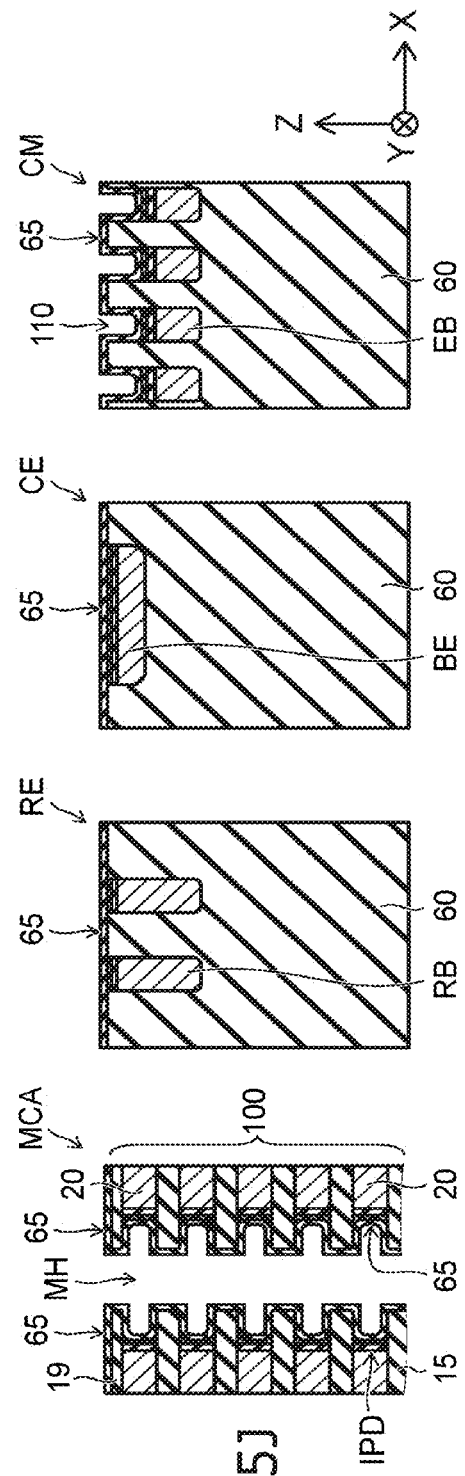

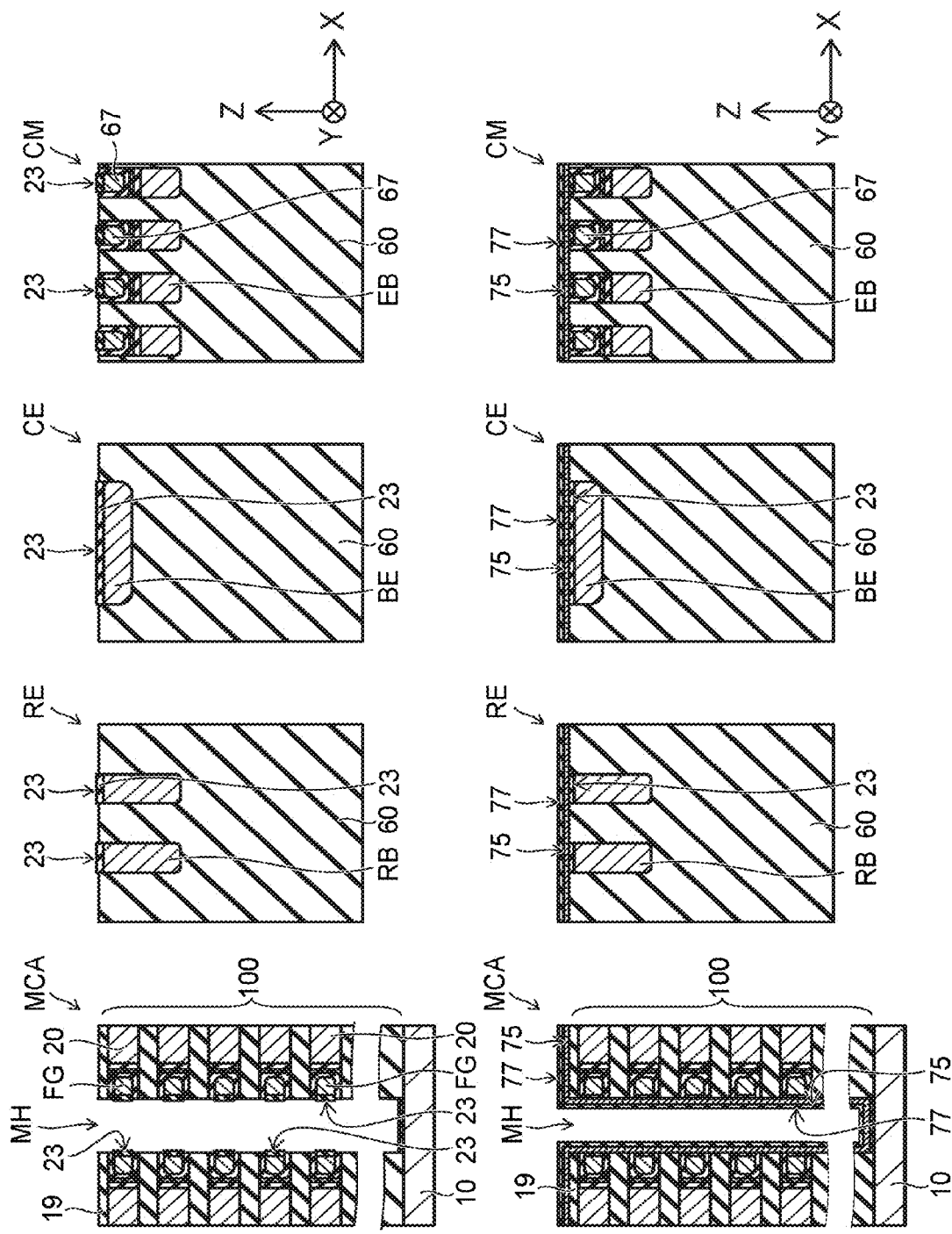

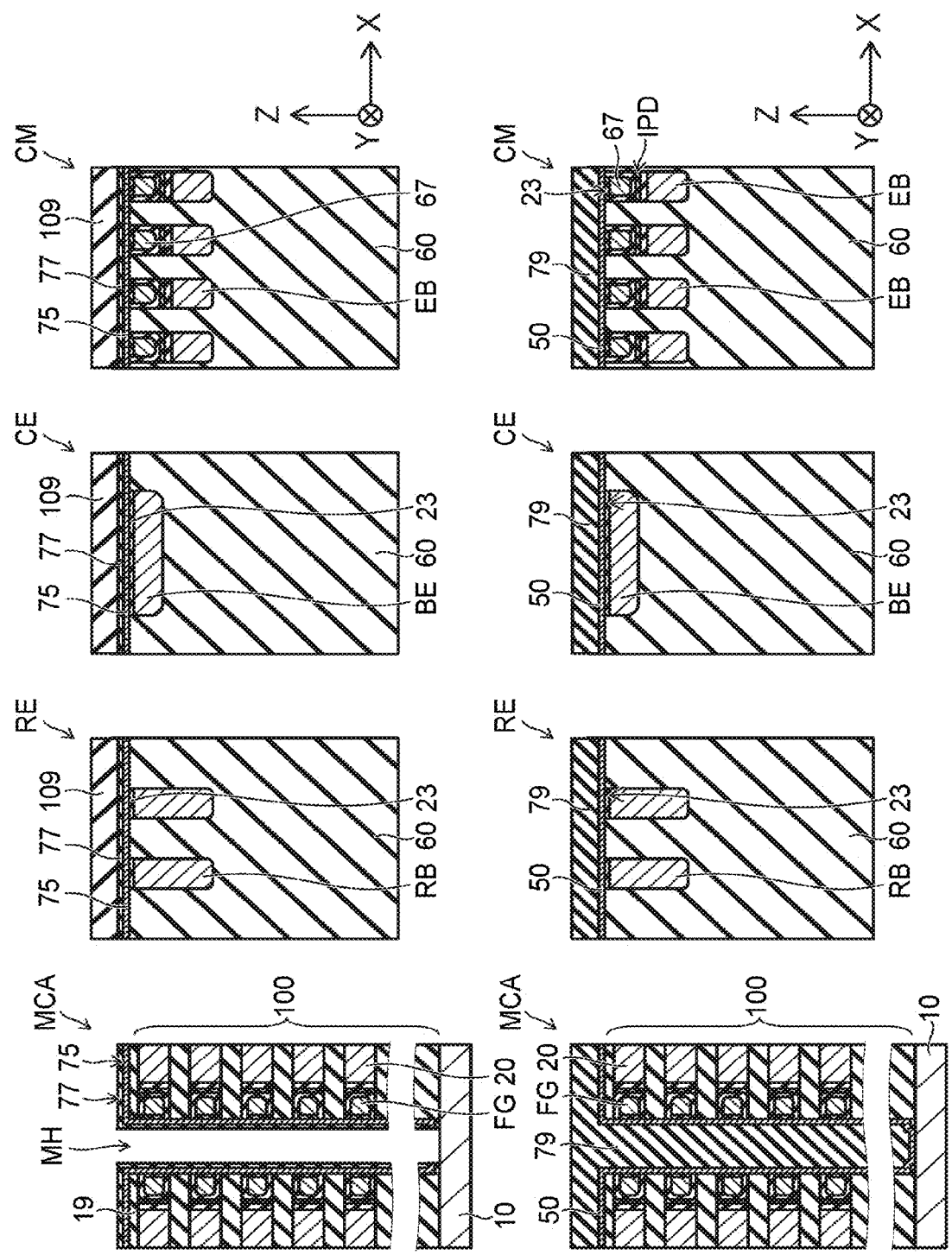

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/375,001 filed on Aug. 15, 2016; the entire contents of which are incorporated herein by reference.

FIELD

Embodiments are generally related to a semiconductor memory device and a method for manufacturing the same.

BACKGROUND

Semiconductor memory devices are under developing, which include three-dimensionally disposed memory cells. For example, a NAND-type memory device has stacked word lines and a semiconductor layer extending in the stacking direction through the word lines. The memory cells are disposed at portions where the semiconductor layer crosses the word lines, and the word lines act as control gates of the memory cells respectively. It is difficult in such a semiconductor memory device to directly monitor the memory cell structure, which is provided between the semiconductor layer and the word lines, in the manufacturing process thereof.

BRIEF DESCRIPTION OF THE DRAWINGS

FIGS. 3A to 3C are partial cross sectional views schematically showing the semiconductor memory device according to the embodiment;

FIGS. 4A and 4B are schematic views showing the structure of the semiconductor memory device according to the embodiment.

DETAILED DESCRIPTION

Figure 1:
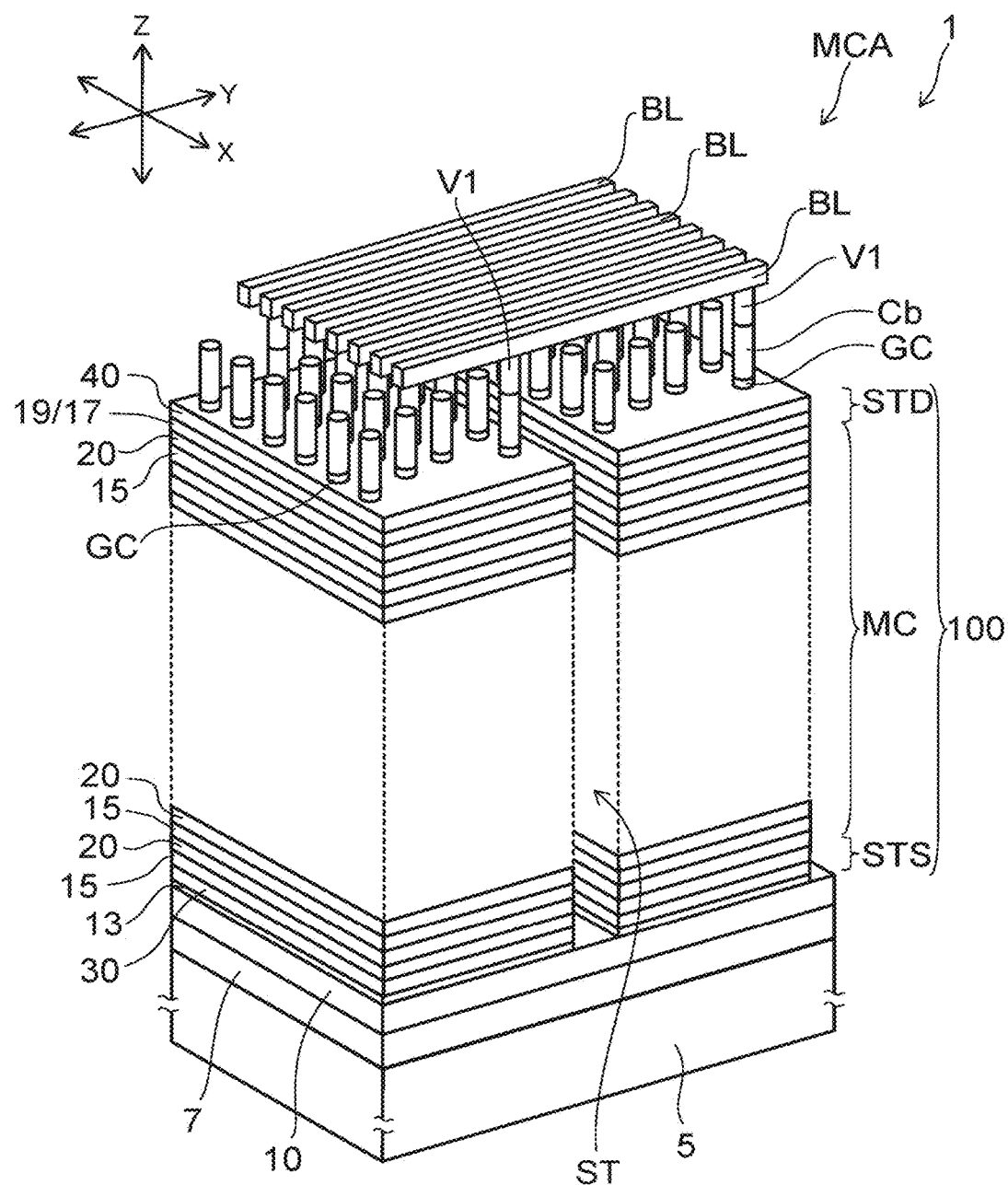
FIG. 1 is a perspective view schematically showing a semiconductor memory device according to an embodiment.

According to one embodiment, a semiconductor memory device includes a stacked body including a plurality of word lines stacked in a first direction; a semiconductor layer extending in the first direction through the word lines; a memory cell provided at a part where the semiconductor layer crosses one of the plurality of word lines, the memory cell including a plurality of cell layers stacked in a second direction from the one of the word lines to the semiconductor layer, the plurality of cell layers including a first insulating layer that is in contact with the semiconductor layer; and at least one of a first structural body and a second structural body provided around the stacked body. The first structural body includes a structure stacking a plurality of monitor layers in the first direction, the plurality of monitor layers including same materials respectively as materials of the plurality of cell layers. The second structural body includes a first electrode, a second electrode and an insulating body positioned, in the first direction, between the first electrode and the second electrode. The insulating body includes same material as a material of the first insulating layer, and has almost same thickness as a thickness of the first insulating layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 2:
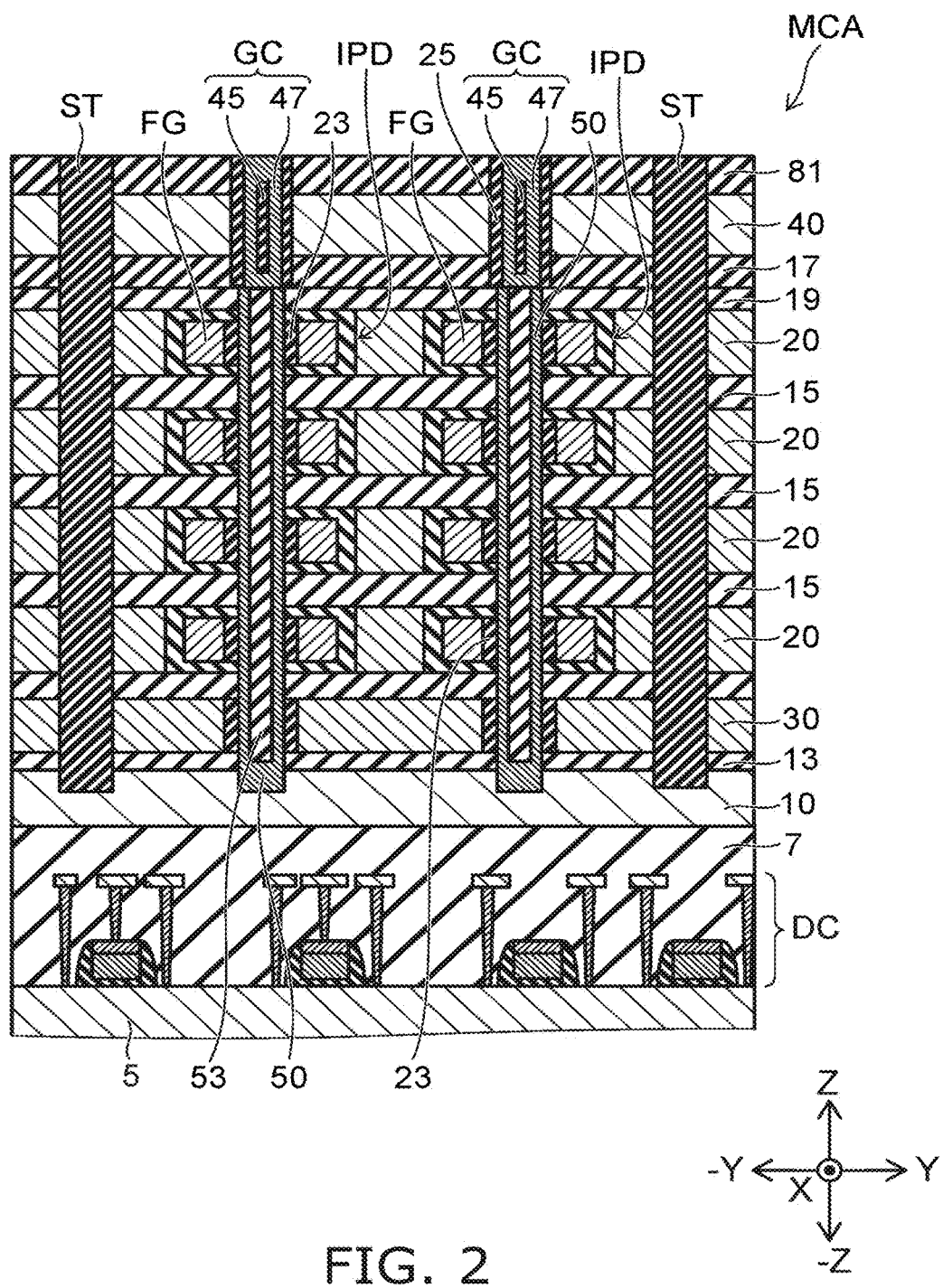
FIG. 2 is a schematic cross-sectional view showing the semiconductor device according to the embodiment.

FIGS. 1 and 2 are views schematically showing a memory cell array MCA of a semiconductor memory device 1 according to a first embodiment. FIG. 1 is a perspective view of the memory cell array MCA, and FIG. 2 is a schematic view showing a cross section in parallel with the Y-Z plane. The semiconductor memory device 1 is, for example, a NAND-type memory device, which includes the three-dimensionally disposed memory cells.

As shown in FIG. 1, the semiconductor memory device 1 includes a conductive layer (hereinafter, a source line 10) provided on a substrate 5 and a stacked body 100. The source line 10 is provided on the substrate 5 with an inter-layer insulating layer 7 interposed. The stacked body 100 includes a plurality of electrode layers (hereinafter, word lines 20, selection gates 30 and 40), which is stacked in the Z-direction. A plurality of stacked bodies 100 are arranged, for example, in the Y-direction on the source line 10. The adjacent stacked bodies 100 in the Y-direction are separated by a slit ST.

The selection gate 30 is provided on the source line 10 with an insulating layer 13 interposed. The word lines 20 are stacked on the selection gate 30. Insulating layers 15 are provided respectively between the selection gate 30 and the lowermost word line 20 and between word lines 20 adjacent to each other in the Z-direction. The selection gate 40 is provided on the uppermost word line 20 with insulating layers 17 and 19 interposed.

The substrate 5 is, for example, a silicon substrate. The source line 10 includes, for example, a polycrystalline silicon layer or a metal layer, or both of them. The source line 10 is provided with a plate-like shape extending in the X-direction and Y-direction. The word lines 20, the selection gates 30 and 40 are, for example, polycrystalline silicon layers having low resistivity. The inter-layer insulating film 7, the insulating layers 13, 15 and 17 are, for example, silicon oxide layers.

The semiconductor memory device 1 includes a plurality of semiconductor layers 50 extending in the Z-direction through the word lines 20 (see FIG. 2). The semiconductor memory device 1 further includes a plurality of gate channel bodies GC extending in the Z-direction through the selection gate 40. The gate channel bodies GC are electrically connected to the semiconductor layers 50 respectively. The gate channel bodies GC are also electrically connected via contact plugs Cb and V1 to bit lines BL respectively. It should be noted that inter-layer insulating layer such as an insulating layer 81 (see FIG. 2) is omitted in FIG. 1 for convenience in showing a structure of the semiconductor memory device 1.

The bit lines BL extend, for example, in the Y-direction above the stacked bodies 100. The semiconductor layers 50 are electrically connected via the gate channel bodies GC to the bit lines BL respectively. One of the semiconductor layer 50 provided in a stacked body 100 may share one bit line BL with one of the semiconductor layer 50 provided in another stacked body 100.

As shown in FIG. 2, the semiconductor memory device 1 includes a driving circuit DC, which is provided between the substrate 5 and the source line 10. The driving circuit DC is electrically isolated from the source line 10 by the inter-layer insulating layer 7. The memory cell array MCA includes a semiconductor layer 50 extending in the Z-direction through the word lines 20 and the selection gate 30. Memory cells MC are provided at portions respectively, where the semiconductor layer 50 crosses the word lines 20. A selection transistor STS (see FIG. 1) is provided at a portion where the semiconductor layer 50 crosses the selection gate 30. A selection transistor STD (see FIG. 1) is further provided at a portion where a gate channel body GC extends through the selection gate 40.

A memory cell MC includes a floating gate FG positioned between a word line 20 and the semiconductor layer 50. The floating gate FG is electrically isolated from the semiconductor layer 50 by an insulating layer 23. The insulating layer 23 acts as a tunnel insulating layer of the memory cell MC. Also, the floating gate FG is electrically isolated from the word line 20 by an inter-ploy dielectric (hereinafter, an IPD).

The semiconductor layer 50 is provided with a cylindrical shape surrounding a lateral surface of a core body 53. The core body 53 is an insulating body extending in the Z-direction through the word lines 20 and having a columnar shape. The semiconductor layer 50 is electrically connected to the source line 10 at a bottom end thereof.

The gate channel body GC includes a semiconductor layer 47 and a core body 45. The core body 45 is an insulating body which extends in the Z-direction through the selection gate 40 and has a columnar shape. The semiconductor layer 47 is formed with a cylindrical shape surrounding a lateral surface of the core body 45, and is positioned between the selection gate 40 and the core body 45. The semiconductor layer 47 extends in the Z-direction along the core body 45, and is electrically connected to the semiconductor layer 50 at a bottom end thereof. An insulating layer 25 is further provided between the selection gate 40 and the semiconductor layer 47. The insulating layer 25 acts as a gate insulating layer of the selection transistor STD.

FIGS. 3A to 3C are schematic views showing elements of the semiconductor memory device 1. A resistor element RE is shown in FIG. 3A. A capacitor element CE is shown in FIG. 3B. A memory cell monitor element (hereinafter, MC monitor element CM) is shown in FIG. 3C. The resistor element RE, the capacitor element CE and the MC monitor element CM is disposed, for example, around the memory cell array MCA (see FIG. 4A).

As shown in FIG. 3A, the resistor element RE have a resistance body RB and hook-up portion HR. The resistor element RE is electrically connected, for example, to a peripheral circuit via interconnections (not shown), and acts as a circuit element. The resistance body RB is, for example, of polycrystalline silicon, and provided in an insulating layer 60. The resistance body RB extends, for example, in the X-Y plane with a prescribed shape, and has a length that provides a prescribed resistance value. The hook-up portion HR connects the resistance body RB to an upper interconnection (not shown). The hook-up portion HR has the same structure as the structure of the gate channel body GC, and includes a semiconductor layer 47 and a core body 45. The semiconductor layer 47 is electrically connected to the resistance body RB.

In this example, a conductive layer 43 is formed on the insulating layer 60 and the resistance body RB. The conductive layer 43 includes, for example, the same material as the material of the selection gate 40. As shown in FIG. 3A, the resistance body RB is electrically isolated from the conductive layer 43 by an insulating layer 23. The hook-up portion HR is provided such as extending through the conductive layer 43. Thus, the semiconductor layer 47 is electrically isolated from the conductive layer 43 by the insulating layer 25.

As shown in FIG. 3B, the capacitor element CE includes a top electrode TE, a bottom electrode BE and an insulating layer 23. The insulating layer 23 is positioned between the top electrode TE and the bottom electrode BE. The top electrode TE is a part of the conductive layer 43. The bottom electrode BE is provided in the insulating layer 60, and includes the same material as the material of the floating gate FG.

The capacitor element CE further includes a hook-up portion HC. The hook-up portion HC connects the bottom electrode BE, for example, to an upper interconnection (not shown). The hook-up portion HC has the same structure as the structure of the gate channel body GC, and includes a semiconductor layer 47 and a core body 45. The semiconductor layer 47 is electrically connected to the bottom electrode BE. The hook-up portion HC is provided such as extending through the top electrode TE, and is electrically isolated from the top electrode TE by an insulating layer 25.

In the manufacturing process of the semiconductor memory device 1, it may be possible to monitor a thickness of the insulating layer 23 by measuring a capacity of the capacitor element CE. Alternatively, the capacitor element CE may be electrically connected to the peripheral circuit (not shown) as a capacitive element.

As shown in FIG. 3C, the MC monitor element CM includes a plurality of electrode bodies EB, IPDs stacked on each of the electrode bodies EB and floating gates FG. The electrode bodies EB, the IPDs and the floating gates FG are provided in the insulating layer 60. Insulating layers 23 are further provided between the floating gates FG and the conductive layer 43. Thus, the MC monitor element CM includes the same structure as a structure of the memory cell MC. Thereby, it is possible in the manufacturing process of the semiconductor memory device 1 to monitor the structure of memory cell MC.

Here, the electrode bodies EB include the same material as the material of the word lines 20, and are arranged in the X-direction along a surface of the insulating layer 60. The electrode bodies EB extend respectively in the Y-direction along the surface of the insulating layer 60. Then, the electrode bodies EB are arranged with almost the same pitch (i.e., a distance between the centers of electrode bodies EB adjacent to each other) as the pitch of the word lines 20 stacked in the Z-direction (i.e., a distance between the centers of word lines 20 adjacent to each other).

FIGS. 4A and 4B are schematic views showing a structure of the semiconductor memory device 1 according to the embodiment. FIG. 4A is a plan view showing the memory cell array MCA and the bit lines BL. FIG. 4B is a schematic view showing a cross section taken along A-A line shown in FIG. 4A. In FIG. 4B, the illustration of insulating layers is omitted for convenience, by which each element is electrically isolated from other.

As shown in FIG. 4A, the bit lines BL each extend in the Y-direction over the memory cell array MCA. Then, a hook-up portion HUP is provided in a place around the memory cell array MCA where no bit line BL is provided.

As shown in FIG. 4B, the memory cell array MCA and the hook-up portion HUP are provided, for example, on the driving circuit DC. The source line 10 extends between the memory cell array MCA and the driving circuit DC and between the hook-up portion HUP and the driving circuit DC. As shown in FIG. 4B, each end of the source line 10 and the word lines 20 is formed into a stair-like shape in the hook-up portion HUP. Then, a plurality of contact plugs CG, CP and CS are provided in the hook-up portion HUP. A contact plug CG is electrically connected to an end of a word line 20, and electrically connects the word line 20 and an upper interconnection MO. A contact plug CP electrically connects the source line 10 and an upper interconnection MO, and a contact plug CS electrically connects the driving circuit DC and an upper interconnection MO.

The resistor element RE, the capacitor element CE and the MC monitor element CM shown in FIGS. 3A to 3C is preferably provided, for example, in an open space area MR around the memory cell array MCA. The open space area MR is, for example, an open space other than the places where the bit lines BL and the hook-up portion HUP are provided.

The insulating layer 60 (see FIGS. 3A to 3C) is provided around the memory cell array MCA. The insulating layer 60, for example, covers the hook-up portion HUP so as to planarize the surface step between the memory cell array MCA and the substrate 5. Then, the contact plugs CG, CP and CS are provided such as extending through the insulating layer 60. The resistor element RE, the capacitor element CE and the MC monitor element CM are provided, for example, on the insulating layer 60 in the open space area MR around the memory cell array MCA.

Hereinafter, a manufacturing method of the semiconductor memory device 1 is described with reference to FIGS. 5A to 5X. FIGS. 5A to 5X are partial cross-sectional views schematically showing the manufacturing process of the semiconductor memory device 1. In each view, the cross sections of the areas where the memory cell array MCA, the resistor element RE, the capacitor element CE and the MC monitor element CM are formed.

As shown in FIG. 5A, a stacked body 100 is formed on the source line 10 (not shown). The stacked body 100 includes insulating layers 15 and word lines 20, which are alternately stacked on the source line 10. The insulating layer 19 is formed as the uppermost layer of the stacked body 100. After the word lines 20 are formed into stairs in the hook-up portion HUP, an insulating layer 60 is further formed around the stacked body 100.

The insulating layers 15 and 60 are, for example, silicon oxide layers. The insulating layer 19 is, for example, a silicon nitride layer. The word lines 20 are, for example, polycrystalline silicon layers having low resistivity. The insulating layers 15, 19, 60 and the word lines 20 are formed, for example, using Chemical Vapor Deposition (CVD). The insulating layer 60 is formed with a thickness thicker than a step height between the substrate 5 and the stacked body 100, and then, is planarized using Chemical Mechanical Polishing (CMP). The insulating layer 19 acts as a stopper layer of CMP.

As shown in FIG. 5B, grooves 101, 103 and 105 are formed in a surface of the insulating layer 60. The grooves 101 are formed in a region where the resistor element RE is to be provided; and the groove 103 is formed in a region where the capacitor element CE is to be provided. The grooves 105 are formed in a region where the MC monitor element CM is to be provided. The groove 103 has a width larger than a width of each groove 105. The grooves 105 are preferably formed to have almost the same width and pitch in the X-direction as the width and pitch in the Z-direction of the word lines 20.

Figure 5C:
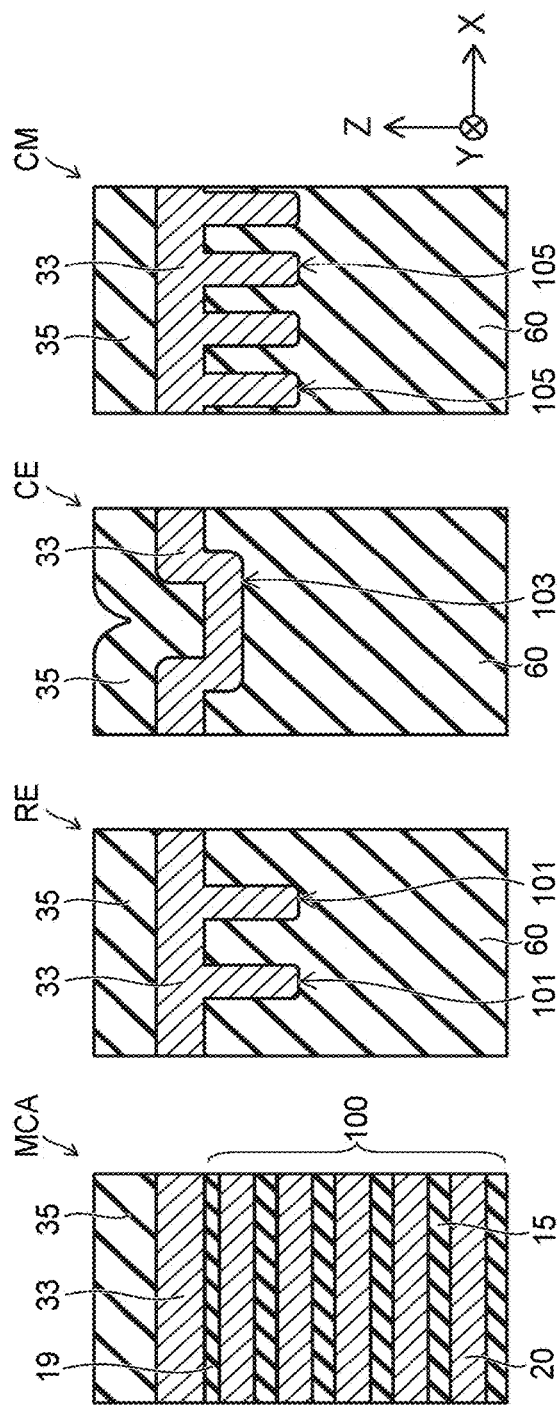
FIGS. 5A to 5X are schematic cross-sectional views showing a manufacturing process of the semiconductor memory device according to the embodiment.

As shown in FIG. 5C, a conductive layer 33 and a sacrifice layer 35 are stacked on the stacked body 100 and the insulating layer 60. The conductive layer 33 is formed to fill the grooves 101 and 105, and is formed to have a thickness larger than a depth of the groove 103.

The conductive layer 33 is, for example, a conductive polycrystalline silicon layer. The sacrifice layer 35 is, for example, a silicon oxide layer. The conductive layer 33 and the sacrifice layer 35 are formed, for example, using CVD.

Figure 5D:
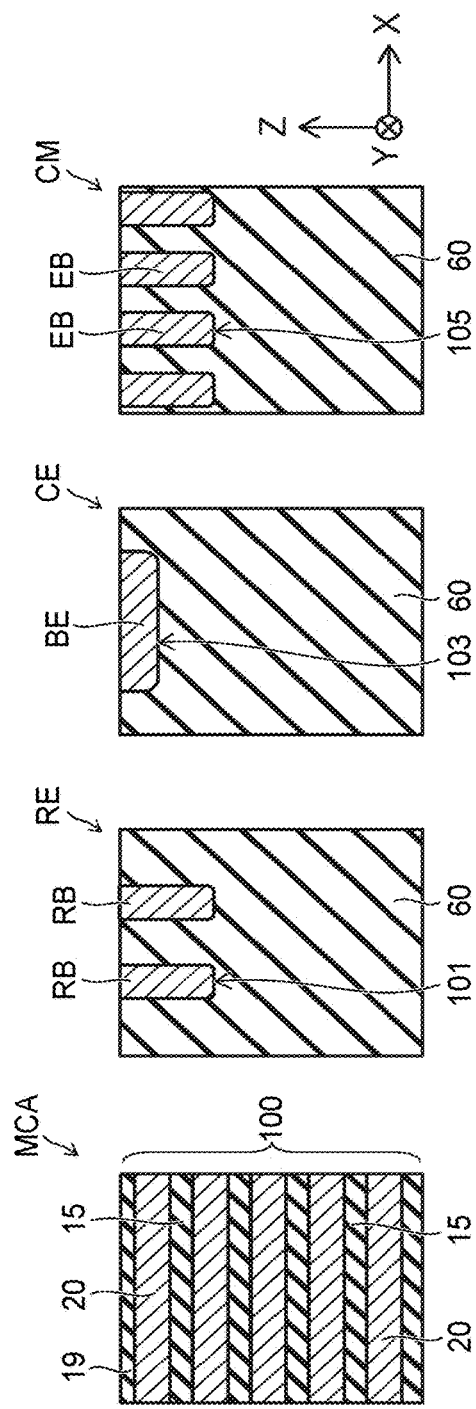

As shown in FIG. 5D, the conductive layer 33 and the sacrifice layer 35 are removed, leaving portions embedded in the grooves 101, 103 and 105. The conductive layer 33 and the sacrifice layer 35 are removed, for example, using CMP. The resistance bodies RB are formed in the grooves 101; and the bottom electrode BE is formed in the groove 103. The electrode bodies EB are formed in the grooves 105.

As shown in FIG. 5E, a memory hole MH is formed with a depth capable of reaching the source line 10 from the top surface of the stacked body 100. The memory hole MH is formed, for example, using Reactive Ion Etching (RIE) for selectively removing the insulating layers 15, 19 and the word lines 20. The source line 10 is exposed at a bottom of the memory hole MH.

As shown in FIG. 5F, recessed portions 20s are formed by etching back the word lines 20 via the memory hole MH. Simultaneously, the resistance bodies RE and the bottom electrode BE are prevented from the etching-back by forming a protective layer 107 in the regions where the resistor element RE and the capacitor element CE are to be provided. The electrode bodies EB are also etched back, and recessed portions 110 are formed in the region where the MC monitor element CM is to be provided. Thus, it is possible in the MC monitor element CM to monitor the etching back amount $W_{B1}$ of word lines 20 by measuring the etching back amount of the electrode bodies EB. The etching back amount of the electrode bodies EB may be monitored, for example, by detecting a depth $D_{B1}$ of the recessed portions 110 using an optical method.

Although the etching back amount $W_{B1}$ is not necessarily coincident with the depth $D_{B1}$ of the recessed portions 110, it is preferable to have larger correlation strength therebetween. For example, it may be possible to enhance the correlation strength between the etching back amount $W_{B1}$ of the word lines 20 and the depth $D_{B1}$ of the recessed portions 110 by making the pitch of electrode bodies EB arranged in the X-direction to be consistent with the pitch of word lines 20 stacked in the Z-direction.

As shown in FIG. 5G, by thermally oxidizing the end surfaces of the word lines 20 via the memory hole MH, insulating layers 57 are formed thereon. At the same time, in the regions where the resistor element RE, the capacitor element CE and the MC monitor element CM are to be provided, the surfaces of the resistance bodies BE, the bottom electrode BE and the electrode bodies EB are also oxidized, and insulating layers 57 are formed on the surfaces thereof. The insulating layers 57 are, for example, silicon oxide layers.

As shown in FIG. 5H, an insulating layer 63 is formed to fill the recessed portions 20s and 110. The insulating layer 63 is formed to cover the inner surface of the memory hole MH and the top surface of the stacked body 100. In the regions where the resistor element RE and the capacitor element CE are to be provided, the insulating layer 63 is formed on the insulating layer 60 and the insulating layer 57. In the region where the MC monitor element CM is to be provided, the insulating layer 63 fills the recessed portion 110, and covers the insulating layer 60. The insulating layer 63 is, for example, a silicon nitride layer formed using CVD.

As shown in FIG. 5I, recessed portions 63s are formed in the inner wall of the memory hole MH by etching back the insulating layer 63. Parts of the insulating layer 63 remain on the insulating layers 57. In the regions where the resistor element RE and the capacitor element CE are to be provided, parts of the insulating layer 63 may remain on the insulating layers 57, or may be fully removed. In the region where the MC monitor element CM is to be provided, the insulating layer 63 is etched back such that parts of the insulating layers 63 remain on the insulating layers 57 at the bottoms of the recessed portions 110. Also in this case, it is possible to monitor the recessed amount of the insulating layer 63 in the memory hole MH by detecting a depth of the recessed portions in the MC monitor element CM.

As shown in FIG. 5J, an insulating layer 65 is formed to cover the inner surface of the memory hole MH and the top surface of the stacked body. Thus, IPDs are formed, which include the insulating layers 57, 63 and 65 stacked on the end surfaces of the word lines 20. In the regions where the resistor element RE, the capacitor element CE and the MC monitor element CM are to be provided, the insulating layer 65 is formed to cover the surface of the insulating layer 60 and the inner surfaces of the recessed portions 110. The IPD structures, which include the stacked insulating layers 57, 63 and 65, are also formed at the bottoms of the recessed portions 110. The insulating layer 65 is, for example, a silicon oxide layer formed using CVD.

Figure 5K:
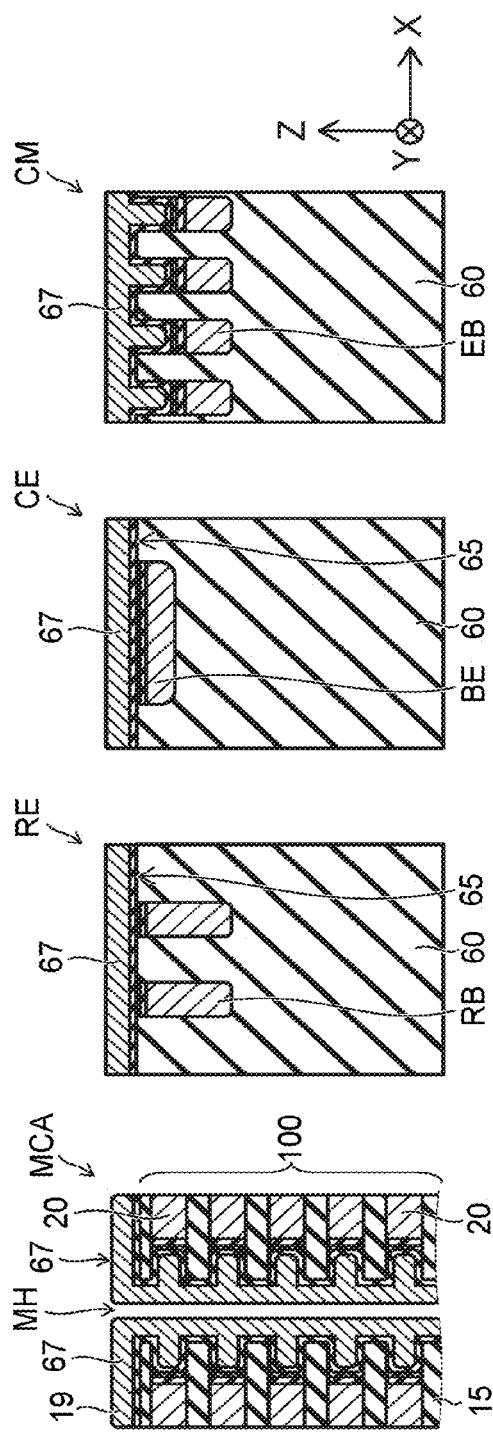

As shown in FIG. 5K, a conductive layer 67 is formed to cover the inner surface of the memory hole MH and the top surface of the stacked body 100. The conductive layer 67 is formed to fill the recessed portions 63s (see FIG. 5I). In the regions where the resistor element RE and the capacitor element CE are to be provided, the conductive layer 67 is formed on the insulating layer 65. In the region where the MC monitor element CM is to be provided, the conductive layer 67 is formed to fill the recessed portions 110. The conductive layer 67 is, for example, a polycrystalline silicon layer formed using CVD.

Figure 5L:
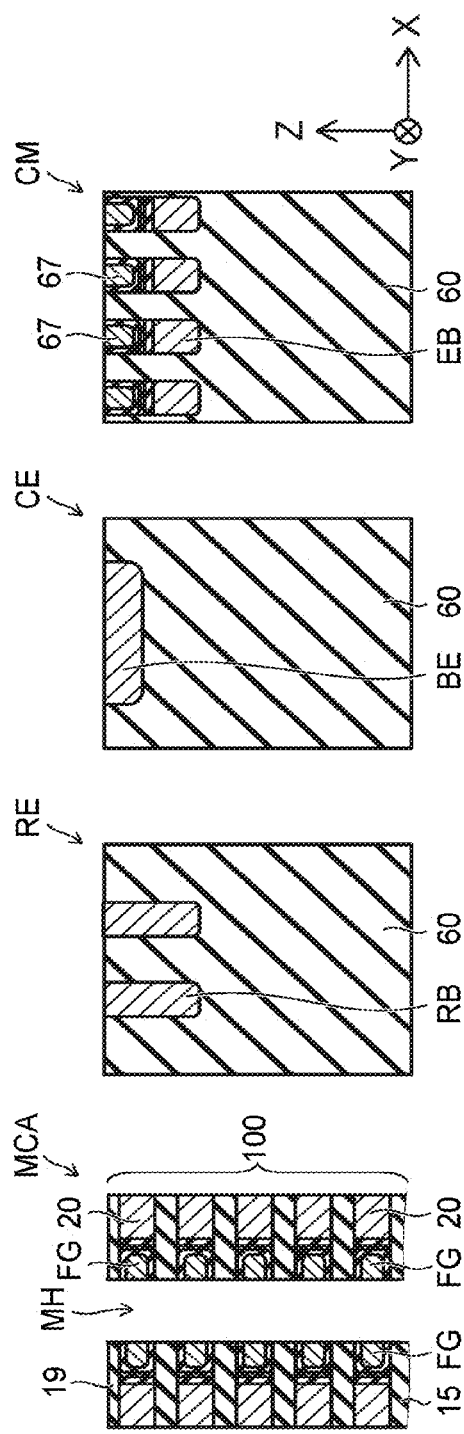

As shown in FIG. 5L, floating gates FG are formed in the inner wall of the memory hole MH by etching back the conductive layer 67. The floating gates FG are parts of the conductive layer 67, which are embedded in the recessed portions 63s. In the regions where the resistor element RE and the capacitor element CE are to be provided, the surfaces of the resistance bodies RB and the bottom electrode BE are exposed respectively by etching back the conductive layer 67, the insulating layers 65, 63 and 57. In the region where the MC monitor element CM is to be provided, the conductive layer 67 is etched back, leaving parts of the conductive layer 67 which are embedded in the recessed portions 110. The parts of the conductive layer 67 that remain in the recessed portions 110 form the same structure as the structure of the floating gates FG in the memory hole MH. It is possible to monitor the etching back amount of the conductive layer 67 by detecting a step height in the surface of the MC monitor element CM through this process.

As shown in FIG. 5M, by thermally oxidizing the floating gates FG that are exposed at the inner surface of the memory hole MH, insulating layers 23 are formed on the surfaces thereof. In the regions where the resistor element RE, the capacitor element CE and the MC monitor element CM are to be provided, by thermally oxidizing the resistance bodies RB, the bottom electrode BE and the conductive layer 67, insulating layers 23 are formed on the surfaces thereof respectively. The insulating layers 23 are, for example, silicon oxide layers.

In the region where the capacitor element CE is to be provided, the insulating layer 23 is preferably formed to have almost the same thickness as the thickness of the insulating layer 23 formed on a floating gate FG. Thereby, it is possible to monitor the thicknesses of the insulating layers 23 formed in the memory hole MH via the capacitance value of the capacitor element CE. Then, the thickness of the insulating layer 23 in the capacitor element CE is not necessary to be rigidly the same as the thickness of the insulating layer 23 formed on the surface of the floating gate FG, and it may be the same degree of thickness, or there may be a correlation therebetween.

As shown in FIG. 5N, a semiconductor layer 75 and an insulating layer 77 are formed to cover the inner surface of the memory hole MH and the top surface of the stacked body 100. The insulating layer 77 is formed on the semiconductor layer 75. Also, in the regions where the resistor element RE, the capacitor element CE and the MC monitor element CM are to be provided, the semiconductor layer 75 and the insulating layer 77 is formed to cover the surfaces thereof. The semiconductor layer 75 is, for example, a polycrystalline silicon layer formed using CVD. The insulating layer 77 is, for example, a silicon oxide layer formed using CVD.

As shown in FIG. 5O, parts of the insulating layer 23, semiconductor layer 75 and the insulating layer 77, which are formed on the bottom of the memory hole MH, are selectively removed, for example, using anisotropic RIE to expose the surface of the source line 10. Then, in the region where the resistor element RE, the capacitor element CE and the MC monitor element CM are to be provided, a protection layer 109 is formed to leave other parts of the semiconductor layer 75 and the insulating layer 77. Alternatively, a protection layer 109 may be formed on the stacked body 100 so that parts of the semiconductor layer 75 and the insulating layer 77 remain thereon. The protection layer 109 is, for example, a resist layer formed using Photolithography.

Then, the surface of the semiconductor layer 75 is exposed by removing the insulating layer 77, for example, using wet etching after the protection layer 109 is removed.

As shown in FIG. 5P, a semiconductor layer 50 is formed by depositing a polycrystalline silicon layer on the semiconductor layer 75. That is, the semiconductor layer 50 includes the semiconductor layer 75. The semiconductor layer 50 is electrically connected to the source line 10 at the bottom end thereof. An insulating layer 79 is further formed on the semiconductor layer 50 to fill the memory hole MH. In the regions where the resistor element RE, the capacitor element CE and the MC monitor element CM are to be provided, the insulating layer 79 is formed on the semiconductor layer 50. The semiconductor layer 50 is, for example, a polycrystalline layer formed using CVD, and the insulating layer 79 is, for example, a silicon oxide layer formed using CVD.

Figure 5Q:
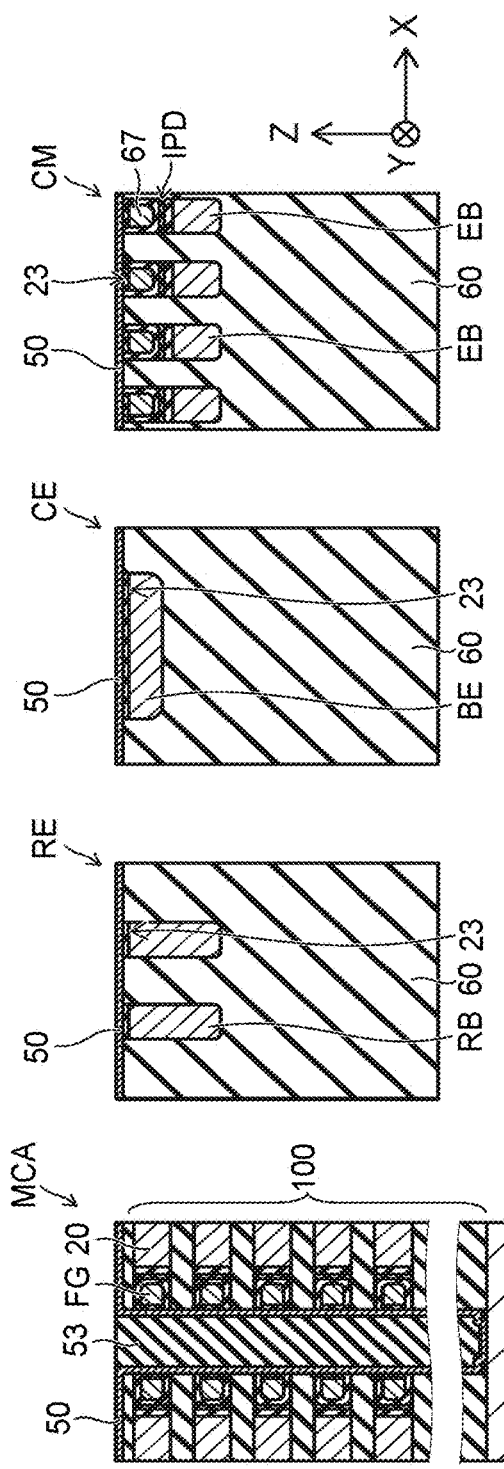

As shown in FIG. 5Q, the insulating layer 79 is removed, for example, using CMP, leaving a portion embedded in the memory hole MH. Thereby, a core body 53 is formed in the memory hole MH. In the regions where the resistor element RE, the capacitor element CE and the MC monitor element CM are to be provided, the insulating layer 79 is removed to expose the semiconductor layer 50.

Figure 5R:
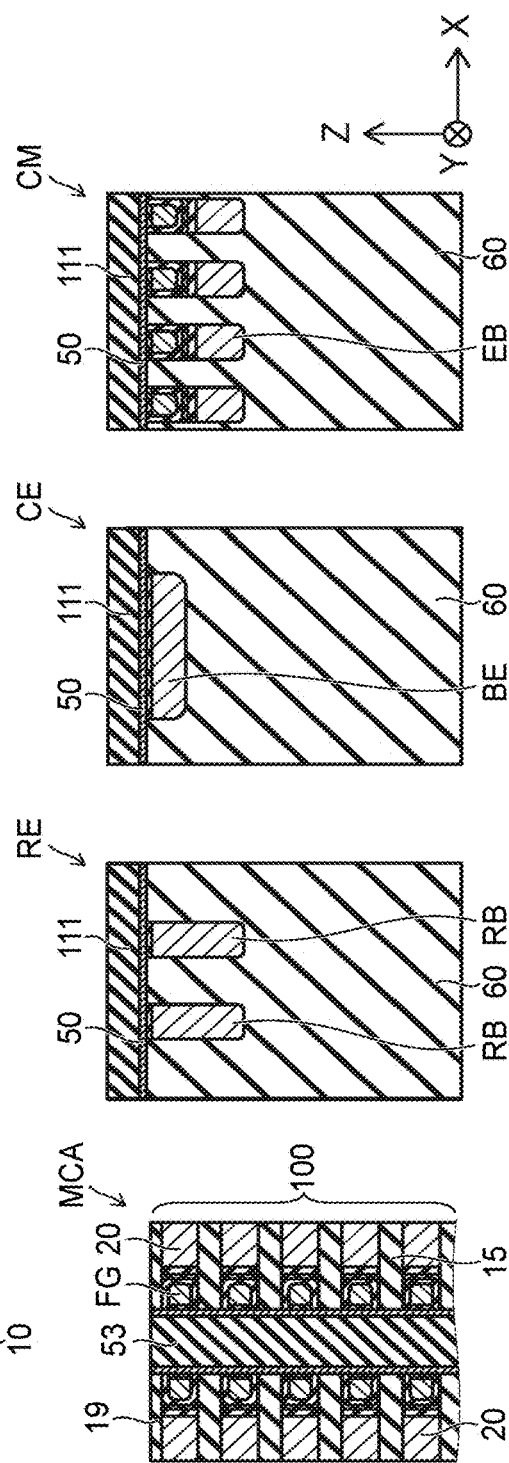

As shown in FIG. 5R, the semiconductor layer 50 is removed, which is formed on the top surface of the stacked body 100. Then, a protection layer 111 is formed on the regions where the resistor element RE, the capacitor element CE and the MC monitor element CM are to be provided; and thus, the semiconductor layer 50 remains thereon. The protection layer 111 is, for example, a resist layer.

Figure 5S:
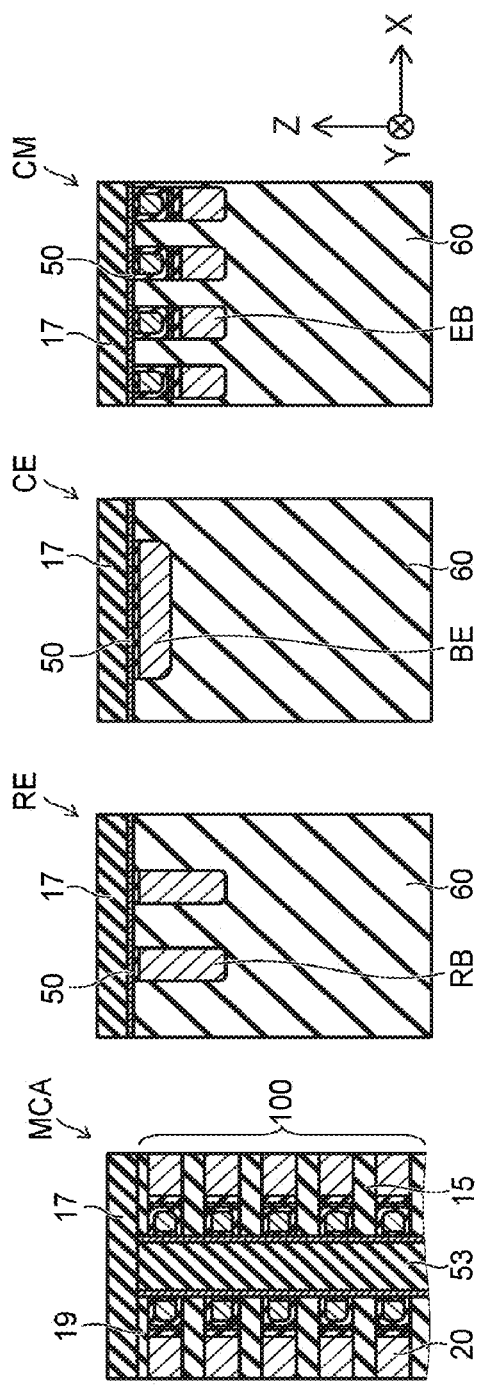

As shown in FIG. 5S, an insulating layer 17 is formed on the stacked body 100. Also, in the region where the resistor element RE, the capacitor element CE and the MC monitor element CM are to be provided, the insulating layer is formed on the semiconductor layer 50. The insulating layer 17 is, for example, a silicon oxide layer formed using CVD.

Figure 5T:
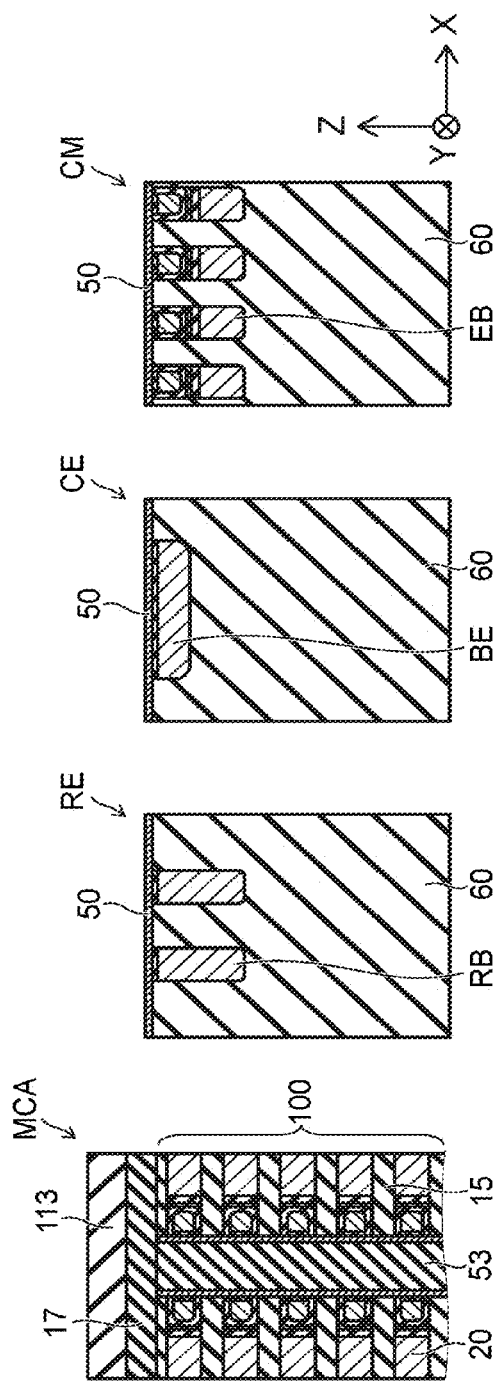

As shown in FIG. 5T, a protection layer 113, which covers the stacked body 100, is formed on the insulating layer 17. The protection layer 113 is, for example, a resist layer. Then, the insulating layer 17 is selectively removed in the regions where the resistor element RE, the capacitor element CE and the MC monitor element CM are to be provided.

Figure 5U:
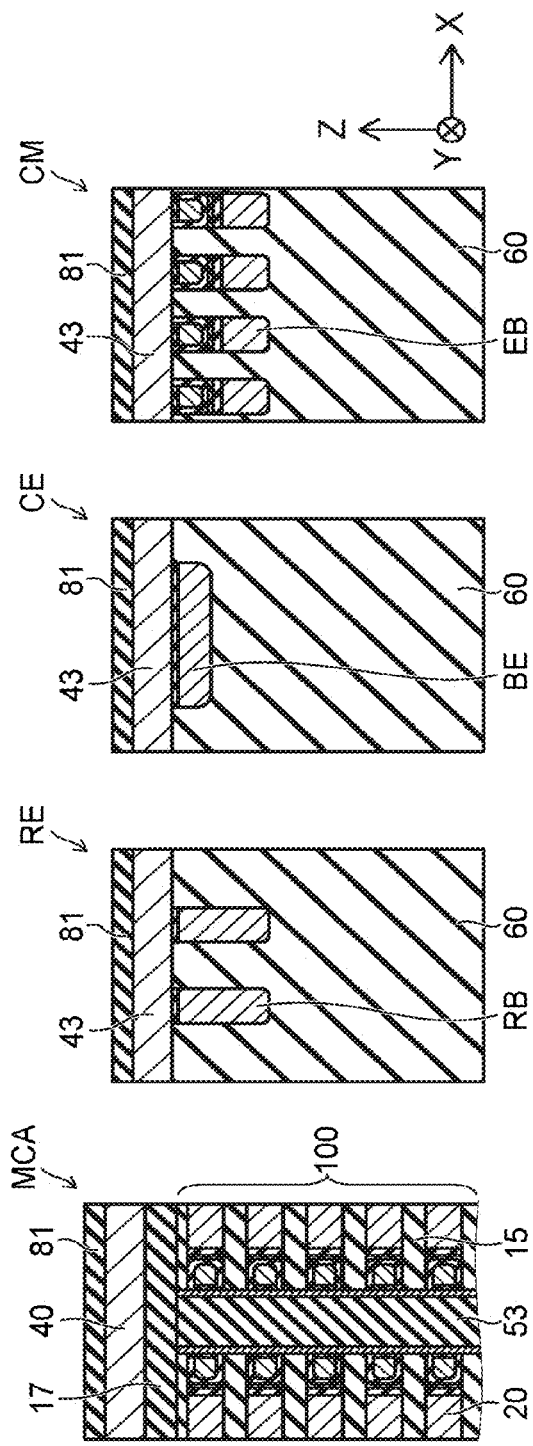

As shown in FIG. 5U, a selection gate 40 is formed on the stacked body 100 with the insulating layer 17 interposed. The selection gate 40 is, for example, a polycrystalline silicon layer of low resistivity, which is formed using CVD. An insulating layer 81 is further formed on the selection gate 40. The insulating layer 81 is, for example, a silicon nitride layer.

Also, in the regions where the resistor element RE, the capacitor element CE and the MC monitor element CM are to be provided, a conductive layer 43 is formed on the semiconductor layer 50, for example, by depositing a polycrystalline silicon layer. The insulating layer 81 is further formed on the conductive layer 43.

Figure 5V:
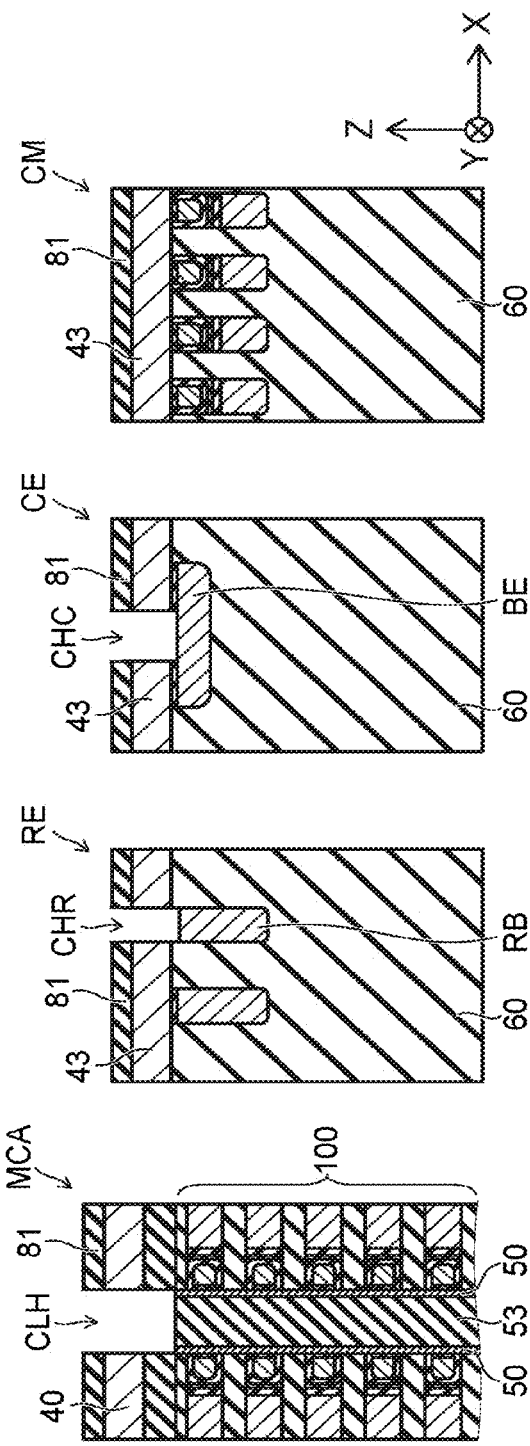

As shown in FIG. 5V, a channel hole CLH, which extends through the selection gate 40 and the insulating layers 17 and 81, is formed in the memory cell array MCA. The channel hole CLH is, for example, in communication with the semiconductor layer 50 and the core body 53. Contact holes CHR and CHC are formed respectively in the regions where the resistor element RE and the capacitor element CE are to be provided. The contact hole CHR is in communication with one of the resistance bodies RB, and the contact hole CHC is in communication with the bottom electrode BE.

Figure 5W:
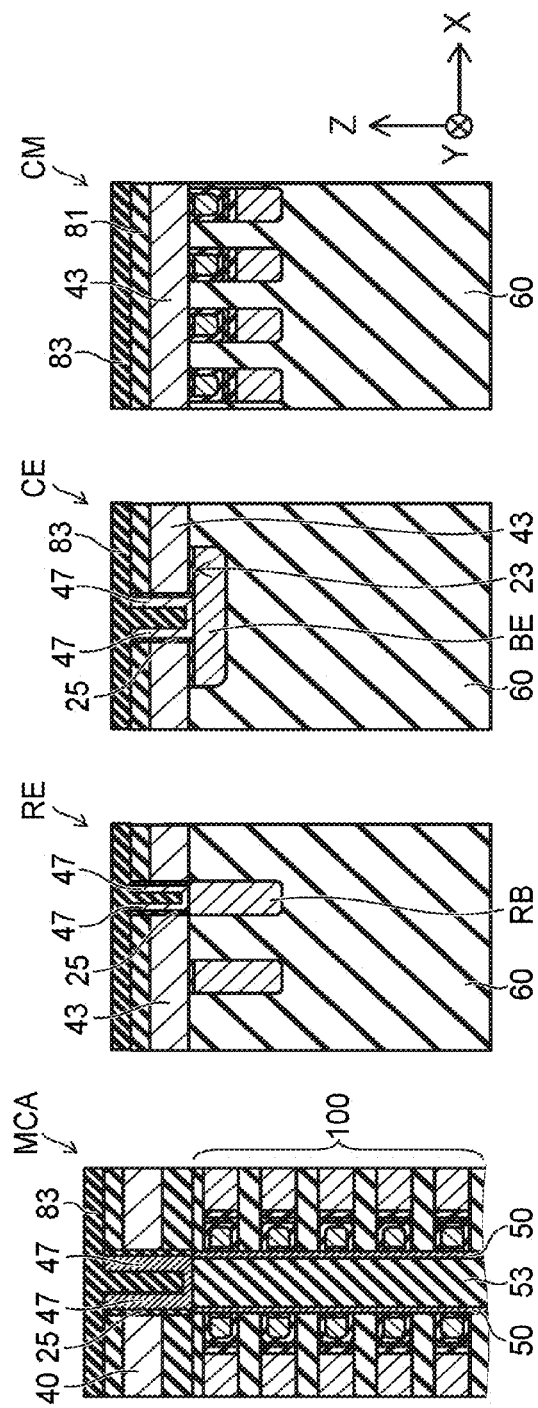
Figure 5X:
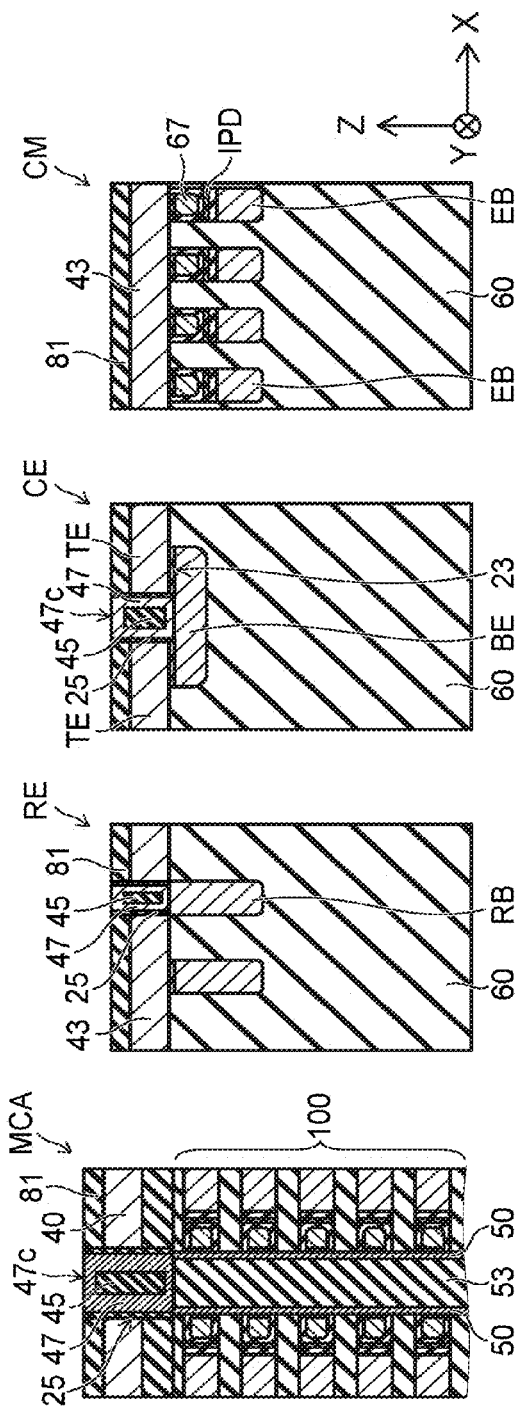

As shown in FIG. 5W, insulating layers 25 are formed on the lateral surfaces of the selection gate 40 and the conductive layer 43, which are exposed at the inner surfaces of the channel hole CLH, the contact holes CHR and CHC. A semiconductor layer 47 and an insulating layer 83 are further formed on the insulating layer 81. A part of the semiconductor layer 47 formed on the top surface of the insulating layer are selectively removed, and other parts of the semiconductor layer 47 cover the inner surfaces of the channel hole CLH, the contact holes CHR and CHC, and parts of the insulating layer 83 are embedded therein. The insulating layers 25 and 83 are, for example, silicon oxide layers formed using CVD, and the semiconductor layer 47 is, for example, a polycrystalline silicon layer of low resistivity formed using CVD. The semiconductor layer 47 and the insulating layer 83 are formed using the procedure shown in FIG. 5N to FIG. 5P through which the semiconductor layer 50 is electrically connected to the source line 10 and the insulating layer 79 is embedded.

Then, core bodies 45 are formed in the channel hole CLH, the contact holes CHR and CHC by etching back the insulating layer 83. Cap layers 47c are embedded on the core bodies 45, and thereby, the memory cell array MCA, the resistor element RE and the capacitor element CE are completed as shown in FIG. 5X. In this process, the insulating layer 81 acts, for example, as a stopper layer of CMP.

As described above, in the embodiment, the resistor element RE, the capacitor element CE and the MC monitor element CM are formed on the insulating layer 60 that is provided around the memory cell array MCA. The resistor element RE and the capacitor element CE may act, for example, as circuit elements in the peripheral circuit or the driving circuit.

Furthermore, it is possible to monitor the layer thickness of the insulating layer 23, i.e. the tunnel insulating layer of the memory cell MC, by monitoring a capacitance value of the capacitor element CE. The MC monitor element CM, which has a similar structure to the memory cell MC, makes it possible to monitor the structure of the memory cell MC in the manufacturing process of the memory cell array MCA. That is, it may be possible in the manufacturing process to monitor the structure of the memory cells MC that are three-dimensionally disposed. Thus, the manufacturing yield of the semiconductor memory device 1 may be improved by feeding back the monitoring results to the manufacturing conditions.

As the resistor element RE, the capacitor element CE and the MC monitor element are disposed in the open space area around the memory cell array MCA, the chip surface may be effectively utilized. There is no necessity for comprising all of the resistor element RE, the capacitor element CE and the MC monitor element CM, and it may be preferable to include at least one of them.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of embodiments described herein may be made without departing from the spirit of the inventions. The accompanying claims and their equivalents are intended to cover such forms or modifications as would fall within the scope and spirit of the invention.

What is claimed is:

1. A semiconductor memory device, the device comprising:
   a stacked body including a plurality of word lines stacked in a first direction;
   a semiconductor layer extending in the first direction through the word lines;
   a memory cell provided at a part where the semiconductor layer crosses one of the plurality of word lines, the memory cell including a plurality of cell layers stacked in a second direction from the one of the word lines to the semiconductor layer, the plurality of cell layers including a first insulating layer that is in contact with the semiconductor layer; and
   at least one of a first structural body and a second structural body provided around the stacked body,
   the first structural body including a structure stacking a plurality of monitor layers in the first direction, the plurality of monitor layers including same materials respectively as materials of the plurality of cell layers, the second structural body including a first electrode, a second electrode and an insulating body positioned, in the first direction, between the first electrode and the second electrode, the insulating body including same material as a material of the first insulating layer, and having almost same thickness as a thickness of the first insulating layer.

2. The device according to claim 1, wherein
the memory cell further includes a floating gate positioned between the one of the word lines and the first insulating layer and a second insulating layer positioned between the one of word lines and the floating gate.

3. The device according to claim 2, wherein
the floating gate includes polycrystalline silicon, and the first insulating layer is a silicon oxide layer.

4. The device according to claim 2, further comprising:
a peripheral insulating layer provided around the stacked body, wherein
the device includes the second structural body, and
the second structural body includes the first electrode, the insulating body and the second electrode, the first electrode being provided in the peripheral insulating layer and including same material as a material of the floating gate, the insulating body being provided on the first electrode, and the second electrode being provided on the peripheral insulating layer and the insulating body.

5. The device according to claim 4, wherein
the second structural body includes a hook-up portion electrically connected to the first electrode, and
the hook-up portion extends in the first direction through the insulating body and the second electrode.

6. The device according to claim 1, further comprising:
a peripheral insulating layer provided around the stacked body, wherein
the device includes the first structural body,
the first structural body includes a plurality of conductive bodies provided in the peripheral insulating layer, the conductive bodies including same material as a material of the word lines, and
the plurality of monitor layers including the same materials respectively as the materials of the plurality of cell layers is stacked on each of the plurality of conductive bodies.

7. The device according to claim 6, wherein
the plurality of conductive bodies are arranged along a surface of the peripheral insulating layer, and have almost the same distance between centers thereof as a distance between centers of adjacent word lines in the first direction.

8. The device according to claim 7, wherein
the plurality of conductive bodies respectively extend along the surface of the peripheral insulating layer.

9. The device according to claim 1, wherein
the device includes the second structural body, and
the first electrode and the second electrode include polycrystalline silicon.

10. A semiconductor memory device, the device comprising:
a stacked body including a plurality of word lines stacked in a first direction;
a first semiconductor layer extending in the first direction through the word lines;
a memory cell provided at a part where the first semiconductor layer crosses one of the plurality of word lines, the memory cell including a plurality of cell layers stacked in a second direction from the one of the word lines to the first semiconductor layer; and
at least one of a first structural body, a second structural body and a third structural body provided around the stacked body,
the first structural body including a structure stacking a plurality of monitor layers stacked in the first direction, the plurality of monitor layers including same materials respectively as materials of the plurality of cell layers,
the second structural body including a first electrode, a second electrode, an insulating body and a first hook-up portion, the insulating body being positioned, in the first direction, between the first electrode and the second electrode, the first hook-up portion being electrically connected to the first electrode and including a second semiconductor layer extending in the first direction through the insulating body and the second electrode, the second semiconductor layer being electrically isolated from the second electrode and being electrically connected to the first electrode, and
the third structural body including a resistance body extending along a plane orthogonal to the first direction, a conductive layer provided on the resistance body with an insulator interposed and a second hook-up portion including a third semiconductor layer extending in the first direction through the conductive layer, the third semiconductor layer being electrically isolated from the conductive layer, and being electrically connected to the resistance body.

11. The device according to claim 10, wherein
the device includes the second structural body and the third structural body, and
the third semiconductor layer includes same material as a material of the second semiconductor layer.

12. The device according to claim 10, further comprising:
a selection gate provided above the plurality of word lines in the first direction; and
a fourth semiconductor layer extending in the first direction through the selection gate, the fourth semiconductor layer being electrically isolated from the selection gate, and being electrically connected to the first semiconductor layer, wherein
the device includes the second structural body and/or the third structural body, and
the fourth semiconductor layer includes same material as a material of the second semiconductor layer and/or the third semiconductor layer.

13. The device according to claim 12, wherein
the plurality of cell layers includes a floating gate positioned between the one of the word lines and the first semiconductor layer, a first insulating layer positioned between the first semiconductor layer and the floating gate, and a second insulating layer positioned between the one of the word lines and the floating gate.

14. The device according to claim 13, further comprising:
a peripheral insulating layer provided around the stacked body, wherein
the device includes the second structural body, and
the second structural body includes the first electrode, the insulating body and the second electrode, the first electrode being provided in the peripheral insulating layer and including same material as a material of the floating gate, the insulating body being provided on the first electrode and including same material as a material of the first insulating layer, and the second electrode being provided on the peripheral insulating layer and the insulating body and including same material as a material of the selection gate.

15. The device according to claim 14, wherein
the insulating body has almost the same thickness as a thickness of the first insulating layer.

16. The device according to claim 14, wherein
the first hook-up portion further includes a first core body of insulator extending in the first direction;
the second semiconductor layer is provided with a cylindrical shape surrounding a lateral surface of the first core body; and
the fourth semiconductor layer is provided with a cylindrical shape surrounding a lateral surface of a second core body of insulator, the second core body extending in the first direction and including a same material as a material of the first core body.

17. The device according to claim 12, further comprising:
a peripheral insulating layer provided around the stacked body, wherein
the device includes the third structural body, and
the third structural body includes the resistance body, the conductive layer and the insulator, the resistance body being provided in the peripheral insulating layer, the conductive layer being provided on the peripheral insulating layer and the resistance body and including same material as a material of the selection gate, and the insulator being provided between the resistance body and the conductive layer.

* * * * *